(12) United States Patent
Lee et al.

(10) Patent No.: US 10,778,179 B2
(45) Date of Patent: Sep. 15, 2020

(54) ACOUSTIC WAVE RESONATOR

(71) Applicant: Samsung Electro-Mechanics Co., Ltd., Suwon-si (KR)

(72) Inventors: Tae Kyung Lee, Suwon-si (KR); Tae Yoon Kim, Suwon-si (KR); Sang Kee Yoon, Suwon-si (KR); Chang Hyun Lim, Suwon-si (KR); Jong Woon Kim, Suwon-si (KR); Moon Chul Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 42 days.

(21) Appl. No.: 15/788,062

(22) Filed: Oct. 19, 2017

(65) Prior Publication Data

US 2018/0278230 A1    Sep. 27, 2018

(30) Foreign Application Priority Data

Mar. 23, 2017  (KR) .................. 10-2017-0036738

(51) Int. Cl.
*H03H 9/02*     (2006.01)
*H03H 9/54*     (2006.01)
(Continued)

(52) U.S. Cl.
CPC ....... *H03H 9/02007* (2013.01); *H01L 41/053* (2013.01); *H01L 41/29* (2013.01);
(Continued)

(58) Field of Classification Search
CPC .......... H03H 9/02007; H03H 9/02118; H03H 9/02157; H03H 9/13; H03H 9/17;
(Continued)

(56) References Cited

U.S. PATENT DOCUMENTS

2005/0110369 A1    5/2005 Onishi et al.
2007/0284971 A1*  12/2007 Sano .............. H03H 9/02094
                                                      310/364
(Continued)

FOREIGN PATENT DOCUMENTS

JP    4554337 B2    9/2010
JP    5111281 B2    1/2013
(Continued)

OTHER PUBLICATIONS

Korean Office Action dated May 22, 2019 in corresponding Korean Patent Application No. 10-2017-0036738 (5 pages in English, 5 pages in Korean).
Japanese Office Action dated May 28, 2019 in corresponding Japanese Patent Application No. 2018-094297 (7 pages in English, 3 pages in Japanese).

*Primary Examiner* — Stephen E. Jones
*Assistant Examiner* — Samuel S Outten
(74) *Attorney, Agent, or Firm* — NSIP Law

(57) ABSTRACT

An acoustic wave resonator includes a resonating part disposed on and spaced apart from a substrate by a cavity, the resonating part including a membrane layer, a first electrode, a piezoelectric layer, and a second electrode that are sequentially stacked. $0\ \text{Å} \leq \Delta Mg \leq 170\ \text{Å}$ may be satisfied, $\Delta Mg$ being a difference between a maximum thickness and a minimum thickness of the membrane layer disposed in the cavity.

17 Claims, 9 Drawing Sheets

(51) Int. Cl.
- *H03H 9/17* (2006.01)
- *H03H 9/13* (2006.01)
- *H03H 3/02* (2006.01)
- *H01L 41/053* (2006.01)
- *H01L 41/29* (2013.01)
- *H01L 41/31* (2013.01)

(52) U.S. Cl.
CPC .............. *H01L 41/31* (2013.01); *H03H 3/02* (2013.01); *H03H 9/02118* (2013.01); *H03H 9/02157* (2013.01); *H03H 9/13* (2013.01); *H03H 9/17* (2013.01); *H03H 9/173* (2013.01); *H03H 9/174* (2013.01); *H03H 9/54* (2013.01); *H03H 2003/023* (2013.01)

(58) Field of Classification Search
CPC .......... H03H 9/173; H03H 9/174; H03H 9/54; H03H 3/02
See application file for complete search history.

(56) References Cited

U.S. PATENT DOCUMENTS

| | | | |
|---|---|---|---|
| 2008/0042780 A1* | 2/2008 | Lee | H03H 3/02 333/187 |
| 2013/0249643 A1* | 9/2013 | Kim | H03H 9/02834 333/133 |
| 2016/0035960 A1 | 2/2016 | Lee et al. | |
| 2017/0237409 A1 | 8/2017 | Han et al. | |
| 2018/0062608 A1 | 3/2018 | Lee et al. | |

FOREIGN PATENT DOCUMENTS

| | | |
|---|---|---|
| JP | 2017-147719 A | 8/2017 |
| KR | 10-2016-0015628 A | 2/2016 |

* cited by examiner

| INVENTIVE EXAMPLE | AREA OF RESONANCE ACTIVE REGION ($\mu m^2$) | Ra/Hw ($\mu m^2$) | RIPPLE COMPONENT (dB) |
|---|---|---|---|
| #1 | 40000 | 81.30 | 2.4139 |
| #2 | 40000 | 99.25 | 2.5456 |
| #3 | 40000 | 112.99 | 2.8386 |
| #4 | 40000 | 127.38 | 3.164 |
| #5 | 40000 | 177.60 | 3.8954 |
| #6 | 40000 | 303.03 | 8.8761 |

ACOUSTIC WAVE RESONATOR

CROSS-REFERENCE TO RELATED APPLICATION(S)

This application claims the benefit under 35 USC § 119(a) of Korean Patent Application No. 10-2017-0036738 filed on Mar. 23, 2017, in the Korean Intellectual Property Office, the entire disclosure of which is incorporated herein by reference for all purposes.

BACKGROUND

1. Field

The present disclosure relates to an acoustic wave resonator.

2. Description of Related Art

Recently, as wireless communications devices have become smaller and smaller, methods of miniaturizing radio frequency component technologies has been actively sought. An example of the miniaturization of the radio frequency component technology includes a bulk acoustic wave (BAW) resonator type filter produced using a semiconductor thin film wafer.

The bulk acoustic wave (BAW) resonator refers to a thin film type element implemented as a filter, where the thin film type element induces resonance. In forming the thin film type element, a piezoelectric dielectric material is deposited on a silicon wafer, and a semiconductor substrate is included. The resonance of the thin film type element utilizes piezoelectric characteristics of the piezoelectric dielectric material.

Fields of application of the bulk acoustic wave (BAW) resonator include small, lightweight filters, oscillators, resonance elements, acoustic wave resonance mass sensors, and the like, and may be included in mobile communications devices, chemical and biological devices, and the like.

Research into structural shapes and other ways for increasing performance characteristics of the bulk acoustic wave resonator is ongoing, and, thus, research into a method of manufacturing the bulk acoustic wave resonator having increased performance characteristics is also ongoing.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic wave resonator includes a resonating part disposed on and spaced apart from a substrate by a cavity, the resonating part including a membrane layer, a first electrode, a piezoelectric layer, and a second electrode that are sequentially stacked. $0 \text{ Å} \leq \Delta Cg \leq 340 \text{ Å}$ may be satisfied, $\Delta Cg$ being a difference between a maximum gap and a minimum gap of the cavity.

$0 \text{ Å} \leq \Delta Mg \leq 170 \text{ Å}$ may be satisfied, $\Delta Mg$ being a difference between a maximum thickness and a minimum thickness of the membrane layer disposed in the cavity.

The resonating part may further include a resonance active region disposed on the cavity, the first electrode and the second electrode may each include connection electrodes extended outside the resonance active region, and the cavity may include at least one opening connected to the outside. $30 \text{ }\mu m \leq Ra/Hw \leq 200 \text{ }\mu m$ may be satisfied, Ra being an area ($\mu m^2$) of the resonance active region, and Hw being a total length ($\mu m$) of the at least one opening.

A width of each of the connection electrodes may be greater than or equal to 60 $\mu m$.

The at least one opening may be formed between the membrane layer and the substrate.

The total length of the at least one opening may be greater than or equal to a total width of the connection electrodes.

The substrate may include an etch stop layer disposed on a surface thereof, and the cavity may be disposed between the etch stop layer and the membrane layer.

The etch stop layer may include a same material as the membrane layer.

In one general aspect, an acoustic wave resonator includes a resonance active region spaced apart from a substrate by a cavity, the resonance active region comprising a membrane layer, a first electrode, a piezoelectric layer, and a second electrode sequentially stacked on the cavity, and at least one opening formed in an outer portion of the cavity connecting the cavity with the outside. $30 \text{ }\mu m \leq Ra/Hw \leq 200 \text{ }\mu m$ is satisfied, Ra being an area($\mu m^2$) of the resonance active region, and Hw being a total length($\mu m$) of the at least one opening.

The acoustic wave resonator of claim 10, may further include respective connection electrodes extending to the outside of the resonance active region from the first electrode and the second electrode, a width of each of the connection electrodes being greater than or equal to 60 $\mu m$.

The total length of the at least one opening may be equal to or greater than a total width of the connection electrodes.

The acoustic wave resonator may further include a cavity layer interposed between the substrate and the resonance active region. The cavity may be disposed in the cavity layer.

The acoustic wave resonator may further include an etching stop part disposed in the cavity layer and disposed along an edge of the cavity.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
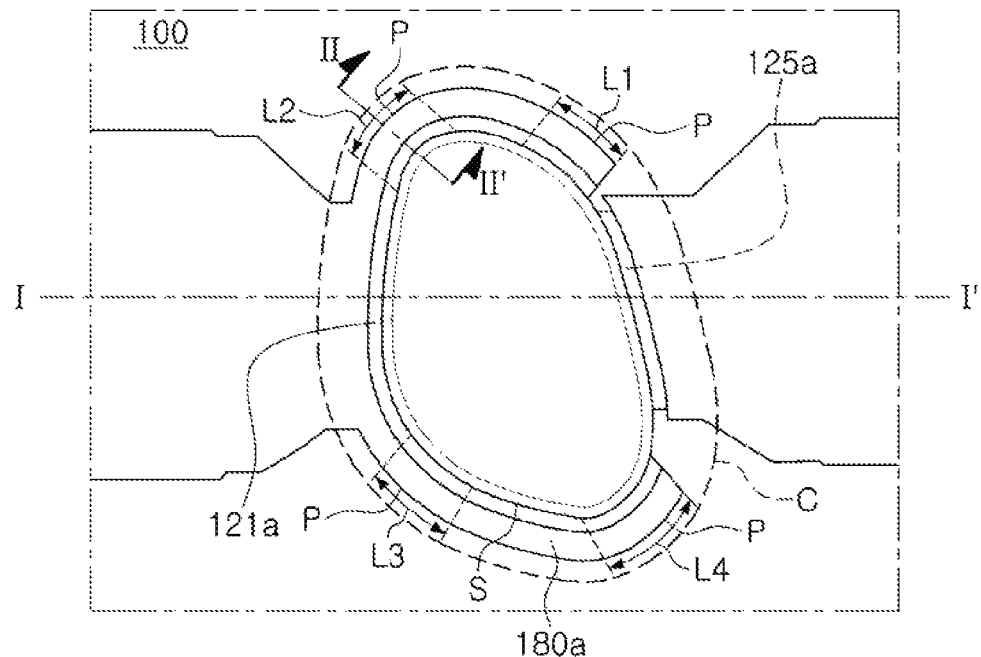
FIG. 1 is a plan view illustrating an example of an acoustic wave resonator.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
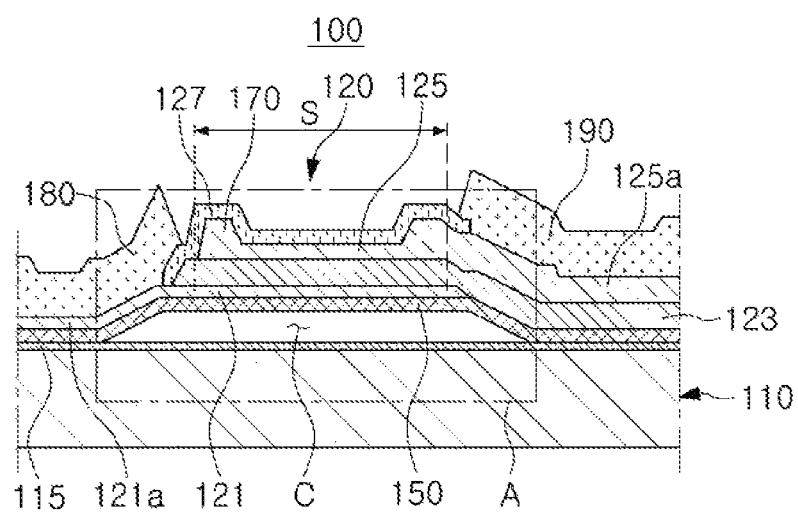
FIG. 2 is a cross-sectional view taken along a line I-I' of FIG. 1.
Figure 3:
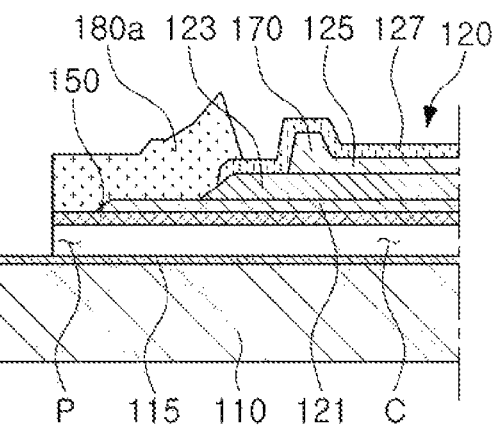
FIG. 3 is a cross-sectional view taken along a line II-II' of FIG. 1.

FIG. 1 is a plan view of an example of an acoustic wave resonator, FIG. 2 is a cross-sectional view taken along a line I-I' of FIG. 1, and FIG. 3 is a cross-sectional view taken along a line II-II' of FIG. 1.

Referring to FIGS. 1 and 2, an example of an acoustic wave resonator 100 includes a substrate 110 and a resonating part 120.

A cavity C is formed between the substrate 110 and the resonating part 120. The resonating part 120 is formed on a membrane layer 150 and is spaced apart from the substrate 110 by the cavity C.

The substrate 110 is a substrate including stacked silicon. For example, as the substrate 110, a silicon wafer is used, or a silicon-on-insulator (SOI) type substrate is used.

The substrate 110 includes etch stop layer 115. The etch stop layer 115 is disposed on one surface of the substrate 110, and may prevent the substrate 110 from being etched by etching gas when the cavity C is formed during the manufacturing of the acoustic wave resonator.

The etch stop layer 115 may be formed of silicon nitride (SiN) or silicon oxide ($SiO_2$). Additionally or alternatively, the etch stop layer may be formed of the same material as a membrane layer 150 to be described below.

The resonating part 120 includes a first electrode 121, a piezoelectric layer 123, and a second electrode 125. The resonating part 120 is formed by sequentially stacking the first electrode 121, the piezoelectric layer 123, and the second electrode 125. Therefore, the piezoelectric layer 123 is disposed between the first electrode 121 and the second electrode 125.

Since the resonating part 120 is formed on the membrane layer 150, the membrane layer 150, the first electrode 121, the piezoelectric layer 123, and the second electrode 125 are sequentially stacked on the substrate 110.

The membrane layer 150, together with the substrate 110, forms the cavity C. The membrane layer 150 is formed along a surface of a sacrificial layer 131 (described below), and may form the cavity C together with the substrate 110 by removing the sacrificial layer 131. Therefore, the membrane layer 150 may be formed of a material which is not easily removed during the forming of the cavity C.

For example, in a case in which halide-based etching gases such as fluorine (F), chlorine (Cl), or the like is used to remove a portion (e.g., a cavity region) of the cavity layer 140, the membrane layer 150 is formed of a material having low reactivity with the above-mentioned etching gases. In this case, the membrane layer 150 may be formed of a dielectric layer containing any one of silicon nitride (SiN), silicon oxide (SiO$_2$), manganese oxide (MgO), zirconium oxide (ZrO$_2$), aluminum nitride (AlN), lead zirconate titanate (PZT), gallium arsenide (GaAs), hafnium oxide (HfO$_2$), aluminum oxide (Al$_2$O$_3$), titanium oxide (TiO$_2$), and zinc oxide (ZnO), or any one of aluminum (Al), nickel (Ni), chromium (Cr), platinum (Pt), gallium (Ga), and hafnium (Hf). However, these materials are merely exemplary, and the configuration is not limited thereto.

The first electrode 121 and the second electrode 125 may be formed of a metal such as gold, molybdenum, ruthenium, iridium, aluminum, platinum, titanium, tungsten, palladium, chromium, nickel, or the like, or alloys of these metals, but is not limited thereto.

The piezoelectric layer 123 partially covers the first electrode 121.

As a material of the piezoelectric layer 123, zinc oxide (ZnO), aluminum nitride (AlN), doped aluminum nitride, lead zirconate titanate, quartz, or the like may be selectively used. The doped aluminum nitride may further include a rare earth metal or a transition metal. As an example, the rare earth metal may include one or more of scandium (Sc), erbium (Er), yttrium (Y), and lanthanum (La). The transition metal may include one or more of hafnium (Hf), titanium (Ti), zirconium (Zr), and magnesium (Mg).

The resonating part 120 as described above includes a resonance active region S including the first electrode 121, the piezoelectric layer 123, and the second electrode 125. The resonance active region S may be a region from which a resonance substantially occurs by vibration of the piezoelectric layer 123, Thus, in FIGS. 1-3, the resonance active region S is defined as a region positioned over the cavity C and disposed in a contour of a frame 170.

The resonating part 120 is spaced apart from the substrate 110 by the cavity C. This configuration may improve a quality factor (Q factor).

The cavity C is formed between the resonating part 120 and the substrate 110. This configuration may prevent acoustic waves generated in the piezoelectric layer 123 from being affected by the substrate 110.

In addition, reflective characteristics of the acoustic wave generated in the resonating part 120 may be improved by the cavity C. Since the cavity C is an empty space and has an impedance close to infinity, the acoustic wave may remain in the resonating part 120 without being lost or deteriorated by the cavity C.

The frame 170 is disposed on an upper portion of the resonating part 120.

The frame 170 may be formed in a ring shape along an edge of the resonating part 120. However, the shape of the frame 170 is not limited thereto, and may also be formed as discontinuous arcs.

The acoustic wave resonator 100 may prevent energy loss of an elastic wave by using the frame 170 to reflect a horizontal direction elastic wave radiated toward an outside of the resonating part 120 to an inside of the resonating part 120. In this configuration, since the horizontal direction elastic wave reduces energy loss, the acoustic wave resonator 100 may have a high Q-factor (kt2).

The high Q-factor may increase the blocking of other frequency bands in implementing a filter or a duplexer, and high kt2 may secure a bandwidth to increase data transmission amount and speed at the time of transmitting and receiving data.

The frame 170 may be formed of a piezoelectric material, a dielectric material, or a metal. For example, the frame 170 may be formed of one of aluminum nitride (AlN), lead zirconate titanate (PZT), silicon oxide (SiO$_2$), titanium oxide (TiO$_2$), molybdenum (Mo), gold (Au), titanium (Ti), copper (Cu), tungsten (W), and aluminum (Al), or a synthetic material having any one thereof as a main component.

The first electrode 121 and the second electrode 125 each include connection electrodes 121a and 125a extended to the outside of the resonating part 120, and a first connecting electrode 180 and a second connecting electrode 190 is connected to the respective connection electrodes 121a and 125a.

The first connecting electrode 180 and the second connecting electrode 190 may be external connecting terminals for confirming characteristics of the resonator and the filter. However, the first connecting electrode 180 and the second connecting electrode 190 are not limited thereto.

In addition, a metal frame 180a formed along a periphery of the first electrode 121 is formed on the first electrode 121.

The metal frame 180a is bonded to the first electrode 121, and penetrates a protective layer 127 to be exposed to the outside.

As shown in FIGS. 1-3, the metal frame 180a extends from the first connecting electrode 180, and may be formed together with the first connecting electrode 180 in an operation of forming the first connecting electrode 180. However, the metal frame 180a is not limited thereto, and may also be spaced apart from the first connecting electrode 180 and may also be manufactured by a different operation from the first connecting electrode 180.

The protective layer 127 is disposed along a surface of the acoustic wave resonator 100, and may protect the acoustic wave resonator 100 from the outside. In this case, the first connecting electrode 180 and the second connecting electrode 190 are exposed to the outside of the protective layer 127. Therefore, the protective layer 127 is disposed along a surface formed by the remaining elements except for the first connecting electrode 180 and the second connecting electrode 190.

The protective layer 127 may be formed of one insulating material of silicon oxide based insulating material, silicon nitride based insulating material, and aluminum nitride based insulating material, but is not limited thereto. The protective layer 127 may be provided to perform frequency trimming.

The acoustic wave resonator configured as described above includes at least one opening P in which the cavity C is opened to the outside. As illustrated in FIG. 1, openings P are disposed in all directions along a contour of the cavity C, and may be used as inlets through which the etching gas is introduced into the cavity C in an operation of manufacturing the cavity C.

The opening P may be formed between the membrane layer 150 and the substrate 110 (e.g., the etch stop layer 115). In addition, the opening P may be formed to expand the cavity C along a surface direction of the cavity C.

Therefore, the opening P may be formed in a side portion or an upper portion of the cavity C and may be formed to have approximately the same gap as a gap of the cavity C.

A method for manufacturing an acoustic wave resonator, such as the one shown in FIG. 1, will be described hereinafter.

FIGS. 4 through 8 are views illustrating an example of a method for manufacturing an acoustic wave resonator.

Figure 4:
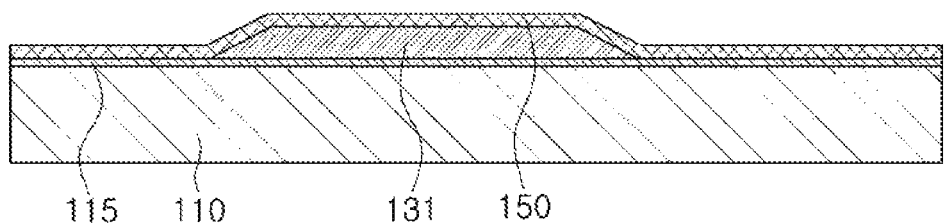
FIGS. 4, 5, 6, 7, and 8 are views illustrating an example of a method for manufacturing an acoustic wave resonator.

First, referring to FIG. 4, the etch stop layer 115 may be formed on the substrate 110.

The etch stop layer 115 may serve to protect the substrate 110 when the sacrificial layer 131 is removed to form the cavity C (FIG. 1). The etch stop layer 115 may be formed of silicon nitride (SiN), silicon oxide ($SiO_2$), or the like, but is not limited thereto.

The sacrificial layer 131 may be then formed on the etch stop layer 115.

The sacrificial layer 131 may be removed by a subsequent etching operation to form the cavity C (FIG. 1). Therefore, the sacrificial layer 131 may be formed of a material such as polysilicon, polymer, or the like that may be easily etched. However, the material of the sacrificial layer 131 is not limited thereto.

In this operation, the sacrificial layer 131 is also be formed on a region in which the opening P (FIG. 1) is formed. Referring to FIG. 4, the sacrificial layer 131 may have a reduced thickness toward an outer portion. The sacrificial layer 131 formed in the opening P may have the same or similar thickness as the central portion. Accordingly, even though various elements are stacked on the sacrificial layer 131 in subsequent manufacturing operations, a state in which a side surface or a top surface of the sacrificial layer 131, formed in the opening P, is exposed to the outside may be maintained.

The membrane layer 150 is then formed on the sacrificial layer 131. The membrane layer 150 positioned on the cavity C serves to maintain a shape of the cavity C and support the resonance active region S (see FIG. 1).

As described above, the membrane layer 150 may be formed of a dielectric layer containing one or more of silicon nitride (SiN), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or one or more of aluminum (Al), nickel (Ni), chromium (Cr), platinum (Pt), gallium (Ga), and hafnium (Hf). However, the material of the membrane layer 150 is not limited thereto.

Figure 5:
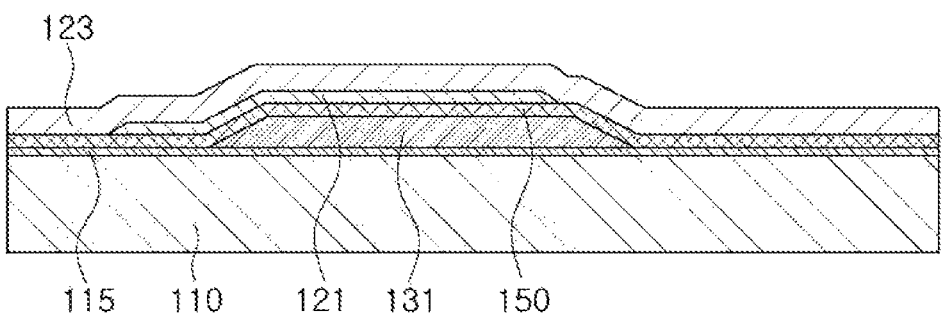

Next, as illustrated in FIG. 5, the first electrode 121 and the piezoelectric layer 123 may be sequentially formed on the membrane layer 150.

The first electrode 121 may be formed by depositing a conductive layer on the membrane layer 150 and then removing (e.g., patterning) an unnecessary portion. The piezoelectric layer 123 may be formed by depositing a piezoelectric material on the first electrode 121.

The first electrode 121 may be formed of a molybdenum (Mo) material. However, the material of the first electrode 121 is not limited thereto, and may include various metals such as gold, ruthenium, iridium, aluminum, platinum, titanium, tungsten, palladium, chromium, nickel, and/or the like, or their alloys.

In addition, the piezoelectric layer 123 may be formed of aluminum nitride (AlN). However, the material of the piezoelectric layer 123 is not limited thereto, and may be formed of various piezoelectric materials such as doped aluminum nitride, zinc oxide (ZnO), lead zirconate titanate, quartz, and the like. The doped aluminum nitride may further include a rare earth metal or a transition metal. As an example, the rare earth metal includes one or more of scandium (Sc), erbium (Er), yttrium (Y), and lanthanum (La). The transition metal may include one or more of hafnium (Hf), titanium (Ti), zirconium (Zr), and magnesium (Mg).

Figure 6:
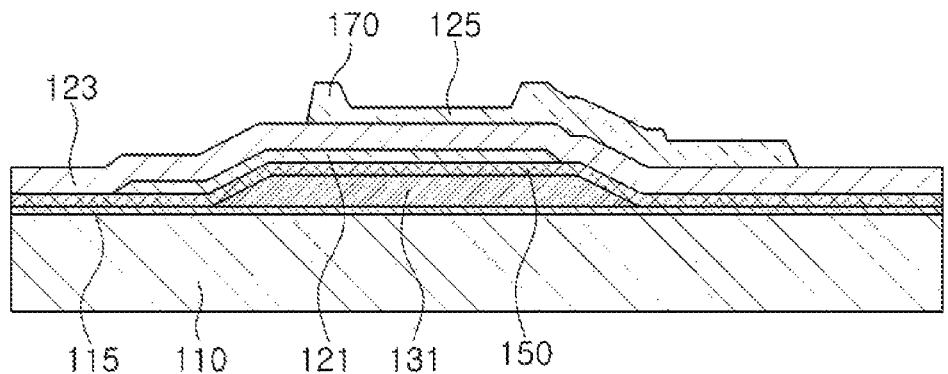

Next, as illustrated in FIG. 6, the second electrode 125 may be formed on the piezoelectric layer 123. According to the present exemplary embodiment, the second electrode 125 may be formed of molybdenum (Mo). However, the material of the second electrode 125 is not limited thereto, and may be formed of various metals such as gold, ruthenium, iridium, aluminum, platinum, titanium, tungsten, palladium, chromium, nickel, and the like.

In addition, during this operation, the frame 170 may be formed along a periphery of the second electrode 125. The frame 170 is formed in an outer portion of the second electrode and has a thickness thicker than that of the second electrode 125.

The frame 170 may be formed of the same material as the second electrode 125, but is not limited thereto.

Figure 7:
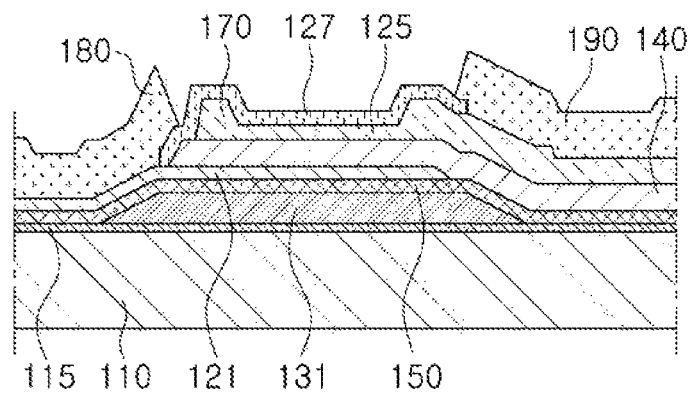

Next, as illustrated in FIG. 7, an unnecessary portion of the piezoelectric layer 123 is removed, and the protective layer 127 is formed along a surface of the resonating part 120. The piezoelectric layer 123 may be removed by a photolithography operation. The piezoelectric layer 127 may be formed of one insulating material of silicon oxide based insulating material, silicon nitride based insulating material, and aluminum nitride based insulating material, but is not limited thereto.

Next, the connection electrodes 121a and 125a (see FIG. 2) are exposed by partially removing the protective layer 127, and the first and second connecting electrodes 180 and 190. The metal frame 180a is then formed on the connection electrodes 121a and 125a.

The first connecting electrode 180 and the metal frame 180a may be formed by depositing gold (Au), copper (Cu), or the like on the first electrode 121. Similarly, the second connecting electrode 190 may be formed by depositing gold (Au), copper (Cu), or the like on the second electrode 125.

Figure 8:
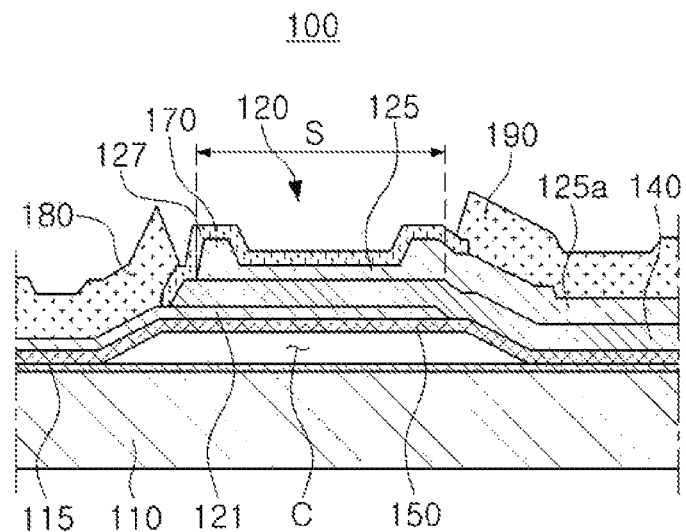

Next, as illustrated in FIG. 8, the cavity C may be formed.

The cavity may be formed by removing the sacrificial layer 131 illustrated in FIG. 7, and consequently, the acoustic wave resonator 100 illustrated in FIG. 1 may be completed. The sacrificial layer 131 may be removed by an etching method.

In a case in which the sacrificial layer 131 is formed of a material such as polysilicon, polymer, or the like, the sacrificial layer 131 may be removed by a dry etching method using a halide-based etching gas (e.g., $XeF_2$) such as fluorine (F), chlorine (Cl), and the like. Therefore, the sacrificial layer 131 may be in contact with the halide-based etching gas supplied through the opening P, and may be removed from a portion positioned in the opening P.

The cavity C of the acoustic wave resonator configured as described above may have a gap difference between a central portion and a peripheral portion.

Figure 9:
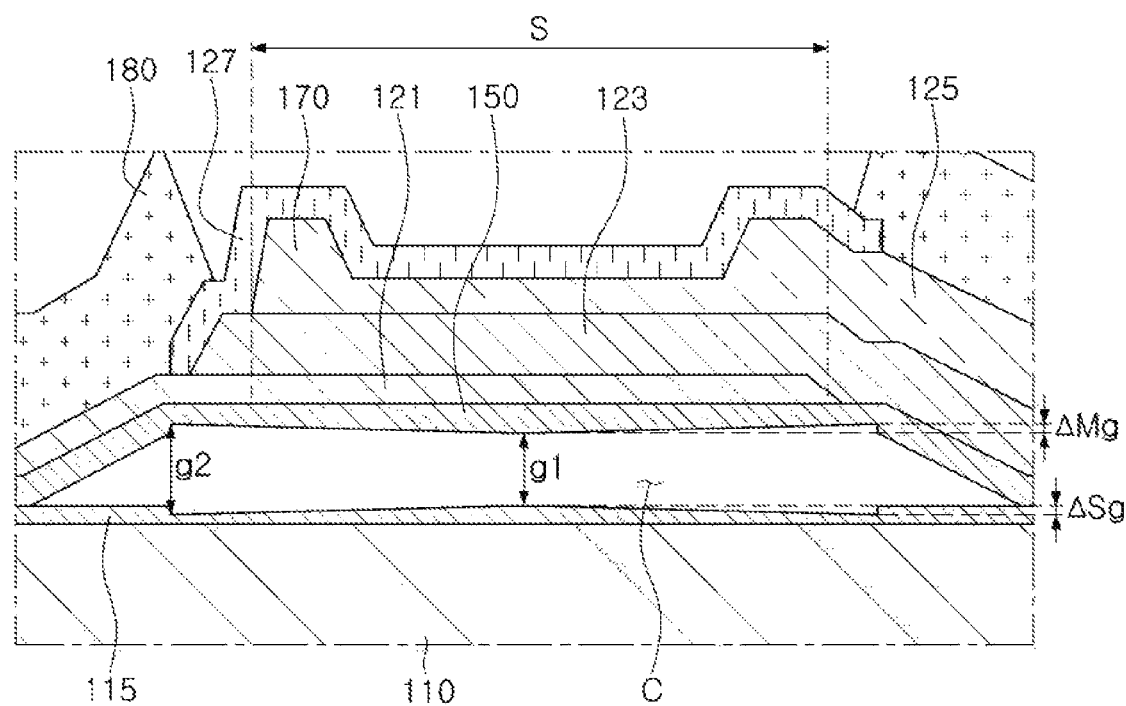
FIG. 9 is an enlarged view of a part A of FIG. 2.

FIG. 9 is an enlarged view of a part A of FIG. 2. Referring to FIG. 9, the cavity C of the acoustic wave resonator may have a gap g1 of the central portion of the cavity C narrower than a gap g2 of the peripheral portion of the cavity C, and accordingly, the cavity C may have a form in which the gap is increased from the central portion to the peripheral portion.

Such a gap difference may be formed by a thickness deviation ($\Delta Mg$, $\Delta Sg$) of the membrane layer 150 and/or the substrate 110.

The cavity C may be formed by removing the sacrificial layer 131 as described above. Therefore, since a portion of the membrane layer 150 or the substrate 110 (e.g., the etch stop layer) together with the sacrificial layer 131 may be removed in the operation of removing the sacrificial layer 131, the above-mentioned thickness deviation ($\Delta Mg$, $\Delta Sg$) may occur.

Figure 10:
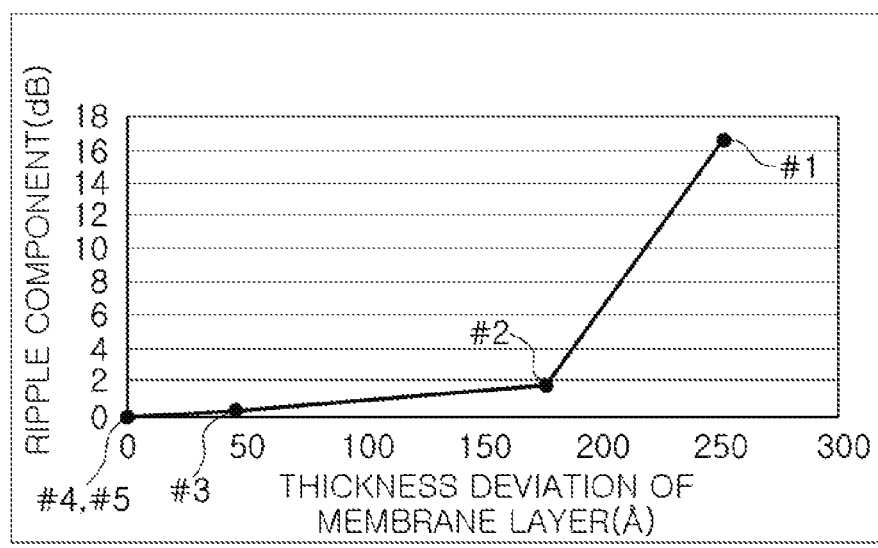
FIG. 10 is a graph illustrating an effect of the acoustic wave resonator illustrated in FIG. 1.
Figure 11:
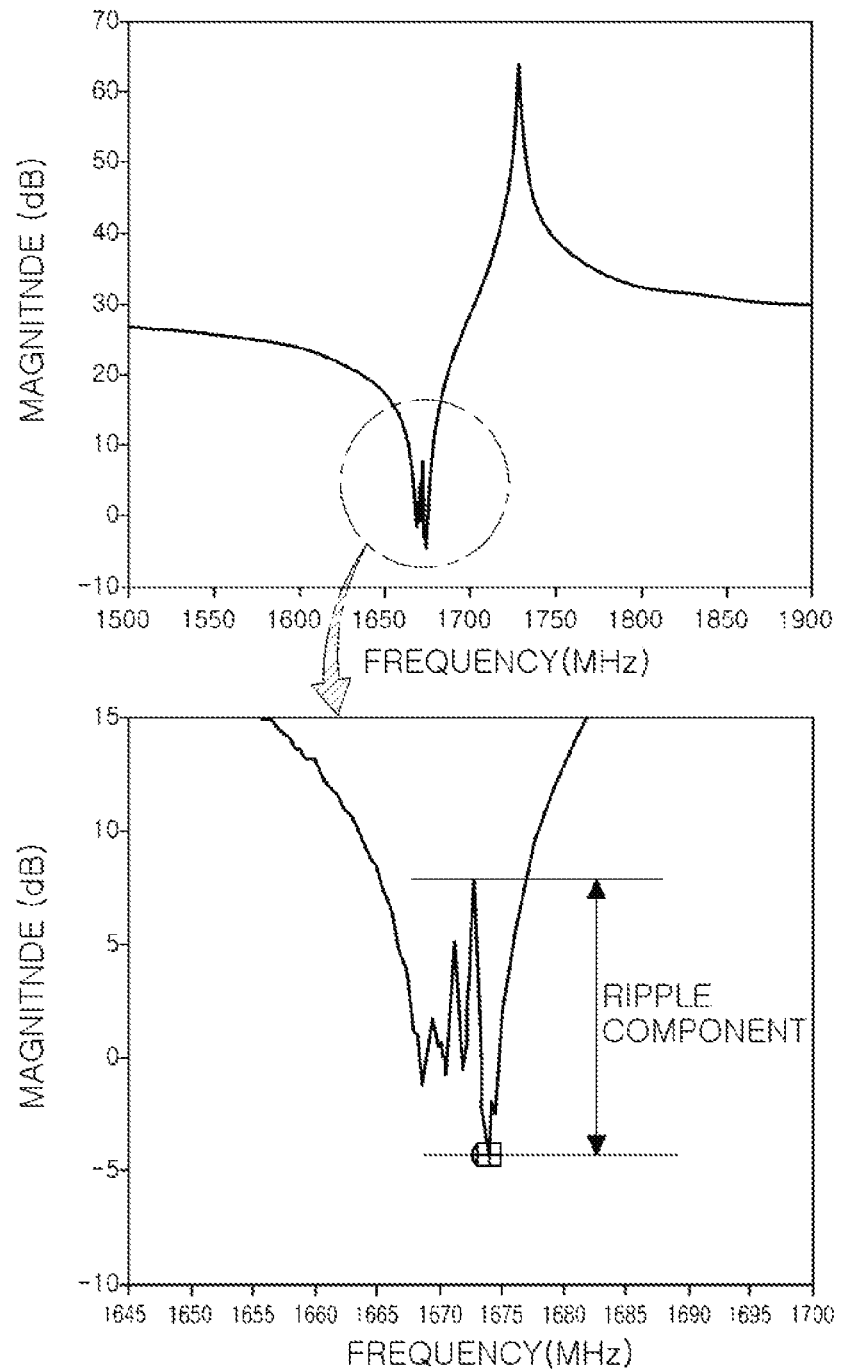
FIG. 11 is a graph illustrating an example of a ripple component of FIG. 10.

FIG. 10 is a graph illustrating an effect of the acoustic wave resonator illustrated in FIG. 1 and FIG. 11 is a graph illustrating a ripple component of FIG. 10.

First, referring to FIG. 11, a ripple component may refer to magnitude (peak to peak) of a ripple appearing at an inflection point of a graph illustrating characteristics of the acoustic wave resonator according a frequency band.

Therefore, as the ripple component is decreased, performance of the acoustic wave resonator may be improved, and as the ripple component is increased, the performance of the acoustic wave resonator may be deteriorated.

FIG. 10 is a table and a graph illustrating results obtained by measuring ripple components of the acoustic wave resonator having various thickness deviations. In a case in which the thickness deviation of the membrane layer 150 is increased in the acoustic wave resonator, the ripple component is also increased.

Here, the thickness deviation of the membrane layer 150 may refer to a difference between a maximum thickness and a minimum thickness of the membrane layer 150 disposed in the cavity C.

In addition, it may be seen from the graph that when the thickness deviation of the membrane layer 150 exceeds 170 Å, the ripple component is rapidly increased.

As such, in an example of the acoustic wave resonator described above with reference to FIGS. 1-3, the thickness deviation of the membrane layer may be in the range of 170 Å or less. Accordingly, in the acoustic wave resonator according to the present exemplary embodiment, the thickness deviation of the membrane layer 150 may be expressed as in Equation 1 below $$0 \text{ Å} \le \Delta Mg \le 170 \text{ Å} \quad \text{(Equation 1)}$$

where $\Delta Mg$ is a difference between a maximum thickness and a minimum thickness of the membrane layer disposed in the cavity.

Here, a lower limit may refer to a case in which the membrane layer 150 is not removed at all during the operation of removing the sacrificial layer 131.

The membrane layer 150 may be formed on the surface of the sacrificial layer 131. In a case in which polysilicon (Si) is used as the sacrificial layer 131, a thickness deviation of about 10 Å may occur on the surface of the sacrificial layer 131 due to roughness of a surface of polysilicon (Si).

Thereby, the membrane layer 150 stacked on the sacrificial layer 131 may have a thickness deviation up to about 10 Å due to roughness of the surface of the sacrificial layer 131. In this case, a lower limit of the thickness deviation of the membrane layer 150 may be defined to 10 Å. However, the lower limit of the thickness deviation of the membrane layer 150 is not limited thereto.

During removal of the sacrificial layer 131, a portion of the etch stop layer 115 of the substrate 110 may also be removed together with the membrane layer 150, and as a result, the thickness deviation $\Delta Sg$ may also occur on the substrate 110 as illustrated in FIG. 9.

In a case in which the etch stop layer 115 is formed of the same material as the membrane layer 150, the same amount of the etch stop layer 115 as that of the membrane layer 150 may be removed. Therefore, the thickness deviation $\Delta Sg$ of the etch stop layer 115 may be limited to the same range as Conditional Equation 1 above.

Thereby, the cavity of the acoustic wave resonator according to the present exemplary embodiment may satisfy Equation 2 in relation to deviations ($\Delta Cg$, $\Delta Sg+\Delta Mg$) of the gap.

$$0 \text{ Å} \le \Delta Cg \le 340 \text{ Å} \quad \text{(Equation 2)}$$

where $\Delta Cg$ may refer to a difference between the maximum gap g2 and the minimum gap g1 of the cavity.

The acoustic wave resonator 100 shown in FIGS. 1-3, for example, may limit a size of the opening P into which the etching gas is introduced to significantly decrease the thickness deviation of the membrane layer 150.

In a case in which the size of the opening P is increased, a rate at which the etching gas which may be introduced into the cavity C may be increased. Therefore, the sacrificial layer 131 may be removed in a shorter time than a structure having a small opening P, and as a result, the etching of the membrane layer 150 or the etch stop layer 115 may be significantly decreased.

Referring to FIG. 1, the openings P may be disposed along the contour of the cavity C. However, the openings P may be formed in a tunnel form from the resonance active region S to the contour of the cavity C, and both ends of the tunnel may have approximately the same size and shape. Therefore, it may be understood that the openings P are disposed along the outer portion of the resonance active region S.

As illustrated in FIG. 1, since the resonance active region S has the connection electrodes 121a and 125a connected to both sides thereof, the openings P may be formed only in the remaining portion except for the portions on which the connection electrodes 121a and 125a are disposed among an outer portion of the resonance active region S.

A width of the connection electrodes 121a and 125a may have a lower limit defined to approx. 60 μm. Since the acoustic wave resonator 100 has two connection electrodes 121a and 125a, approx. 120 μm of the periphery of the resonance active region S may be used to dispose the connection electrodes 121a and 125a.

Therefore, an overall periphery of the resonance active region S may be 120 μm or more to accommodate connection electrodes 121a and 125a.

Since the overall periphery of the resonance active region S is increased as an area of the resonance active region S, the opening P may also be formed to be large. Therefore, referring to in FIG. 1, the size of the opening P may be numerically limited based on a ratio of the area of the resonance active region and the length of the opening P.

The acoustic wave resonator 100 may satisfy Equation 3 below in relation to the size of the opening P.

$$30 \text{ μm} \le Ra/Hw \le 200 \text{ μm} \quad \text{(Equation 3)}$$

Here, Ra may refer to an area (μm$^2$) of the resonance active region S, and Hw may refer to an overall length (μm) of the openings P. The area of the resonance active region S may refer to an overall area of the resonance active region S illustrated on a plane of the acoustic wave resonator illustrated in FIG. 1, and the length of the openings P may refer to the overall length of the openings P formed along the contour of the cavity C.

Therefore, the reduction in Ra/Hw indicates that the overall length of the openings P is increased and the openings P are formed along an overall periphery of the resonance active region S except for the connection electrodes 121a and 125a.

Referring to FIG. 1, four openings P may be included in the acoustic wave resonator 100. Therefore, Hw may be defined as a sum of lengths (L1, L2, L3, and L4) of the respective openings P.

For example, in a case in which the overall periphery of the resonance active region S is 400 μm (for convenience of calculation, it is assumed that the resonance active region S having a square shape of which one side has a length of 100 μm is formed), and the width of the connection electrode is 60 μm, a maximum length in which the openings P may be formed may be limited to 280 μm. In this case, since the area of the resonance active region S is 10000 μm$^2$, Ra/Hw of 35.7 μm may be calculated. Therefore, it may be seen that Ra/Hw is included in the range of Equation 3.

In a case in which the overall periphery of the resonance active region S is 240 μm (for convenience of calculation, it is assumed that the resonance active region S having a square shape of which one side has a length of 60 μm is formed), and the width of the connection electrode is 60 μm, the maximum length in which the openings P may be formed may be limited to 120 μm. In this case, since the area of the resonance active region S is 3600 μm2, Ra/Hw of 30 μm may be calculated. Therefore, Ra/Hw of the above example may also be included in the range of Equation 3, and it may be seen that Ra/Hw of the present example is a lower limit value of Equation 3.

In a case in which the overall length (L1+L2+L3+L4) of the openings P is shorter than an overall width of the connection electrodes 121a and 125a, Ra/Hw may be 30 μm or more. Therefore, when the overall length (L1+L2+L3+L4) of the openings P is the same as or greater than the overall width of the connection electrodes 121a and 125a, Ra/Hw may be included in the range of Equation 3.

Since the lower limit value of Equation 3 is a value derived by limiting the overall width of the connection electrodes 121a and 125a to 120 μm, when the widths of the connection electrodes 121a and 125a are changed, the lower limit value may also be changed.

Figure 12:
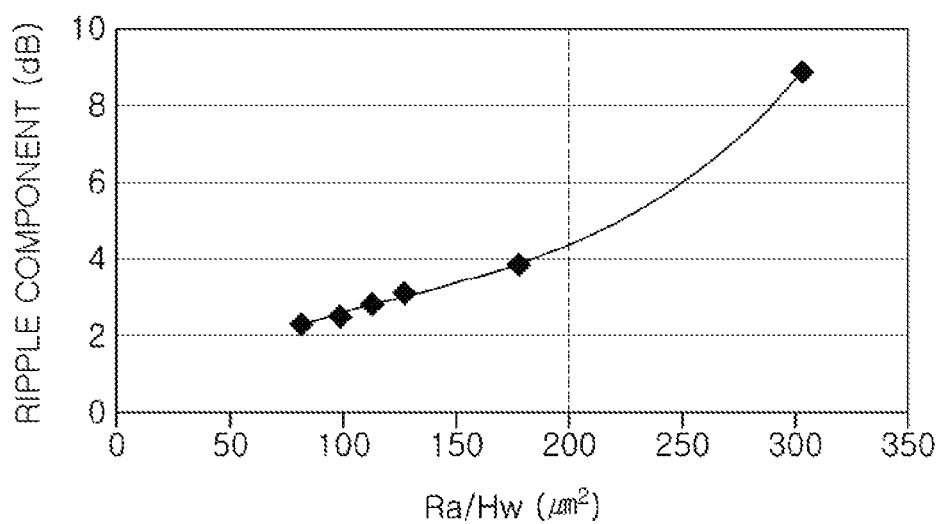
FIG. 12 is a view illustrating a change in the ripple component according to a change in Ra/Hw.

FIG. 12 is a view illustrating a change in the ripple component according to a change in Ra/Hw, and illustrates results obtained by measuring the change in the ripple component according to the change in Ra/Hw while constantly maintaining the area of the resonance active region S in a table and a graph.

Referring to FIG. 12, it may be seen that as a value of Ra/Hw is decreased, the ripple component is also decreased. In addition, referring to the graph, it may be seen that when the value of Ra/Hw is increased to 200 μm or more, the ripple component is sharply increased as illustrated in the graph.

Therefore, the acoustic wave resonator described above may define 200 μm, which is a limit point at which Ra/Hw is relatively and linearly increased, as an upper limit value of Ra/Hw.

The acoustic wave resonator described above may be capable of significantly decreasing the ripple component to increase resonance performance. Specifically, the thickness deviation between the membrane layer and the etch stop layer may be limited, and to this end, the length of the opening may be limited.

Since the sacrificial layer may be rapidly removed as the length of the opening is increased, the removal of the membrane layer and the etch stop layer together with the sacrificial layer may be significantly reduced, whereby gap deviation of the cavity may be reduced.

Figure 13:
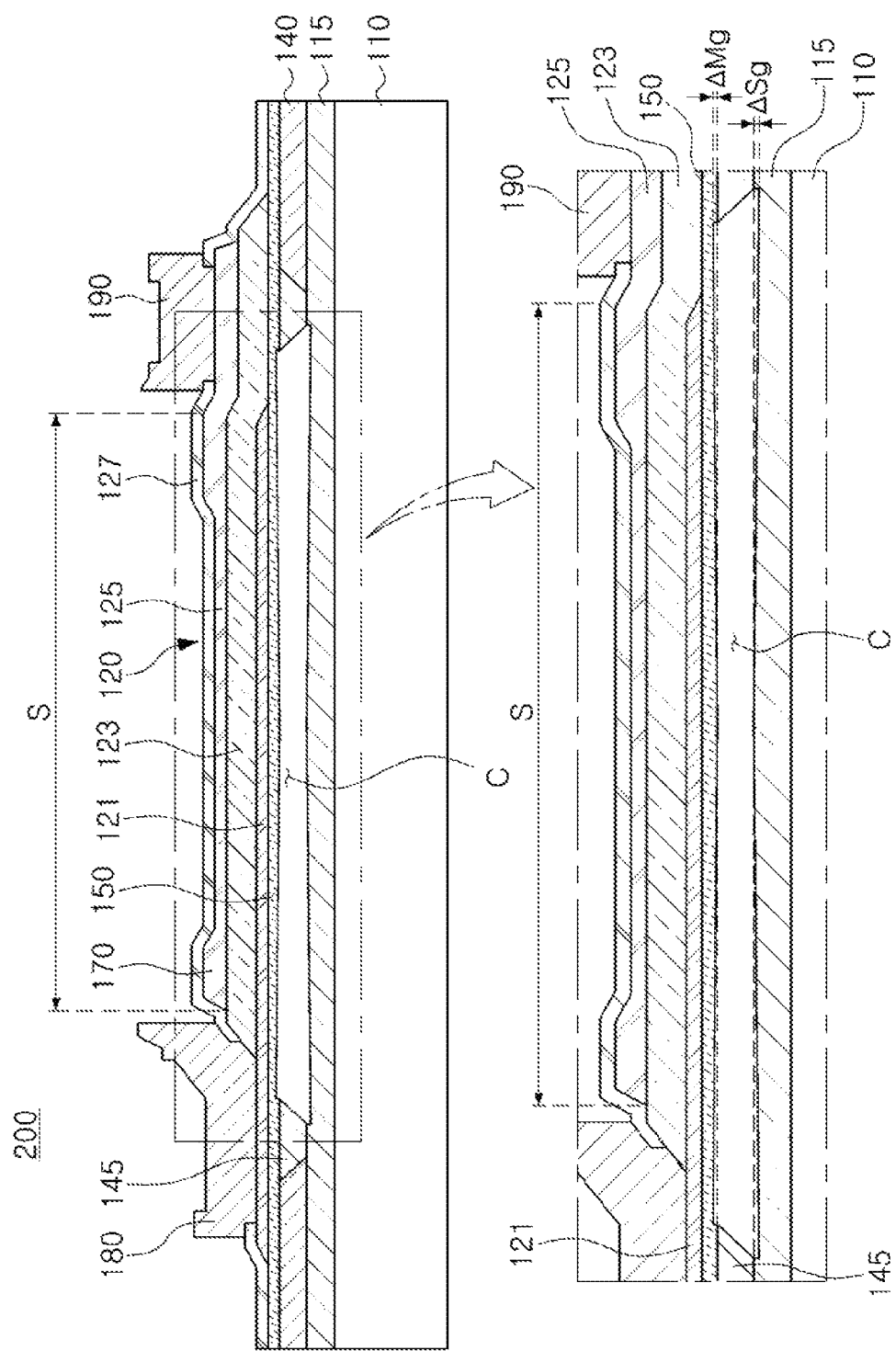
FIG. 13 is a schematic cross-sectional view illustrating an example of an acoustic wave resonator.

FIG. 13 is a schematic cross-sectional view illustrating another example of an acoustic wave resonator.

Referring to FIG. 13, an acoustic wave resonator 200 may be a bulk acoustic wave resonator (BAW), and may include the substrate 110, the cavity layer 140, and the resonating part 120.

The substrate 110 is a substrate including stacked silicon. For example, as the substrate 110, a silicon wafer may be used, or a silicon-on-insulator (SOI) type substrate may be used as the substrate 110.

The substrate 110 includes the etch stop layer 115 including silicon nitride (SiN) or silicon oxide ($SiO_2$). The etch stop layer 115 is disposed on one surface of the substrate 110, and may prevent the substrate 110 from being etched by the etching gas when the cavity C is formed during the manufacturing of the acoustic wave resonator.

The cavity layer 140 is formed on the substrate 110, and the cavity C and an etching stop part 145 are disposed in the cavity layer 140.

The cavity C is formed as an empty space, and may be formed by removing a portion of the cavity layer 140.

Since the cavity C is formed in the cavity layer 140, the resonating part 120 formed on the cavity layer 140 is generally flat.

The etching stop part 145 is disposed along an edge of the cavity C. The etching stop part 140 may prevent the cavity C from being etched beyond a cavity region. Therefore, a horizontal region of the cavity C may be defined by the etching stop part 145.

The membrane layer 150 is formed on the cavity layer 140 to define a vertical region of the cavity C together with the substrate 110. Therefore, the membrane layer 150 may also be formed of a material which is not easily removed in an operation of forming the cavity C.

For example, in a case in which halide-based etching gases such as fluorine (F), chlorine (Cl), and the like are used to remove a portion (e.g., a cavity region) of the cavity layer 140, the membrane layer 150 may be formed of a material having low reactivity with the above-mentioned etching gases. In this case, the membrane layer 150 may be formed of a dielectric layer containing a material such as silicon nitride (SiN), silicon oxide (SiO2), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide (TiO2), or zinc oxide (ZnO), or a material such as aluminum (Al), nickel (Ni), chromium (Cr), platinum (Pt), gallium (Ga), or hafnium (Hf). However, the configuration is not limited thereto.

The resonating part 120 includes the first electrode 121, the piezoelectric layer 123, and the second electrode 125. The resonating part 120 is formed by sequentially the first electrode 121, the piezoelectric layer 123, and the second electrode 125. Therefore, the piezoelectric layer 123 is disposed between the first electrode 121 and the second electrode 125.

Since the resonating part 120 is formed on the membrane layer 150, the membrane layer 150, the first electrode 121, the piezoelectric layer 123, and the second electrode 125 are sequentially stacked on the substrate 110.

The resonating part 120 includes the resonance active region S formed by the first electrode 121, the piezoelectric layer 123, and the second electrode 125. The resonance active region S may be a region from which a resonance substantially occurs by vibrations of the piezoelectric layer 123. The resonance active region S is defined as a region positioned over the cavity C and disposed in a contour of a frame 170.

The first electrode 121 and the second electrode 125 may be formed of a metal such as gold, molybdenum, ruthenium, iridium, aluminum, platinum, titanium, tungsten, palladium, chromium, nickel, or the like, or alloys thereof, but is not limited thereto.

The piezoelectric layer 123 covers the first electrode 121.

As a material of the piezoelectric layer 123, zinc oxide (ZnO), aluminum nitride (AlN), doped aluminum nitride, lead zirconate titanate, quartz, or the like may be selectively used. The doped aluminum nitride may further include a rare earth metal or a transition metal. As an example, the rare earth metal may include one or more of scandium (Sc), erbium (Er), yttrium (Y), and lanthanum (La). The transition metal may include one or more of hafnium (Hf), titanium (Ti), zirconium (Zr), and magnesium (Mg).

The frame 170 is disposed on an upper portion of the resonating part 120.

The frame 170 may be formed in a ring shape along an edge of the resonating part 120. However, the form/shape of the frame 170 is not limited thereto, and may also be formed in a form discontinuous arcs.

The frame 170 may be formed of, for example, a piezoelectric material, a dielectric material, or a metal material. For example, the frame 170 may be formed of one or more of aluminum nitride (AlN), lead zirconate titanate (PZT), silicon oxide ($SiO_2$), titanium oxide ($TiO_2$), molybdenum (Mo), gold (Au), titanium (Ti), copper (Cu), tungsten (W), and aluminum (Al), or a synthetic material having any one thereof as a main component.

The protective layer 127 is disposed along a surface of the acoustic wave resonator 100, and may protect the acoustic wave resonator 100. The protective layer 127 is disposed along a surface formed by the second electrode 125 and the frame 170.

The protective layer 127 may be formed of one insulating material of silicon oxide based insulating material, silicon nitride based insulating material, and aluminum nitride based insulating material, but is not limited thereto.

The first electrode 121 and the second electrode 125 are formed extend outside of the piezoelectric layer 120, and are connected to the first connecting electrode 180 and the second connecting electrode 190, respectively.

The first connecting electrode 180 and the second connecting electrode 190 may be formed of metal materials such as gold (Au), a gold-tin (Au—Sn) alloy, copper (Cu), a copper-tin (Cu—Sn) alloy, alloys thereof, or the like.

The first connecting electrode 180 and the second connecting electrode 190 may be used as external connecting terminals for confirming characteristics of the resonator and the filter. However, the first connecting electrode 180 and the second connecting electrode 190 are not limited thereto.

The acoustic wave resonator according to the embodiment shown in FIG. 13 and described above may limit the range of the thickness deviation ($\Delta Mg$) of the membrane layer 150, the range of the gap deviation ($\Delta Cg$) of the cavity C, and the size of the opening by Equations 1 to 3 described above.

Hereinafter, an example of a filter including the bulk acoustic wave resonator described above will be described with reference to FIGS. 14 and 15.

Figure 14:
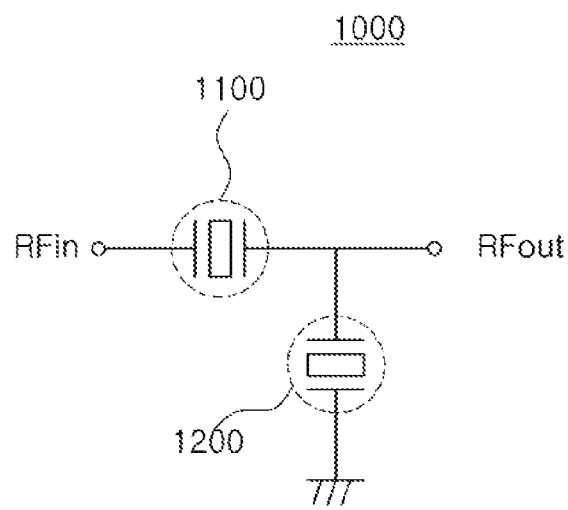
FIG. 14 is a schematic circuit diagram illustrating an example of a filter.

FIG. 14 is a schematic circuit diagram illustrating an example of a filter. Each of plural bulk acoustic wave resonators employed in the filter illustrated in FIG. 14 may be the acoustic wave resonator illustrated in FIG. 1 or 13.

Referring to FIG. 14, a filter 1000 is formed in a ladder type filter structure. Specifically, the filter 1000 includes a bulk acoustic wave resonators 1100 and 1200. A first bulk acoustic wave resonator 1100 may be connected in series between a signal input terminal to which an input signal RFin is input and a signal output terminal from which an output signal RFout is output, and a second bulk acoustic wave resonator 1200 may be connected between the signal output terminal and a ground.

Figure 15:
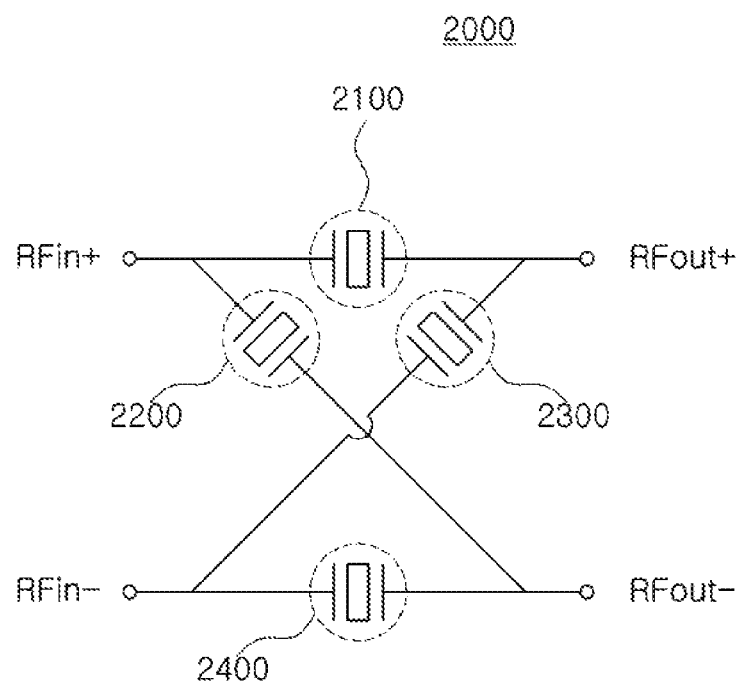
FIG. 15 is a schematic circuit diagram illustrating an example of a filter.

FIG. 15 is a schematic circuit diagram illustrating an example of a filter. Each of the bulk acoustic wave resonators employed in the filter illustrated in FIG. 15 may be the acoustic wave resonator illustrated in FIG. 1 or 13.

Referring to FIG. 15, a filter 2000 is formed in a lattice type filter structure. Specifically, the filter 2000 includes bulk acoustic wave resonators 2100, 2200, 2300, and 2400 to filter balanced input signals RFin+ and RFin− to output balanced output signals RFout+ and RFout−.

As set forth above, according to the exemplary embodiments described above, the acoustic wave resonator may limit the gap deviation of the cavity to increase resonance performance, and may limit the length of the opening used to form the cavity for this purpose.

Since the sacrificial layer may be rapidly removed as the length of the opening is increased, the removal of the membrane layer together with the sacrificial layer may be significantly reduced, whereby the gap deviation of the cavity may be reduced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic wave resonator, comprising:
a resonating part disposed on and spaced apart from a substrate by a cavity, the resonating part comprising a membrane layer, a first electrode, a piezoelectric layer, and a second electrode that are sequentially stacked on the cavity,
wherein a thickness deviation of the membrane layer is expressed as 0 Å<$\Delta Mg$≤170 Å, where $\Delta Mg$ is a difference between a maximum thickness and a minimum thickness of the membrane layer disposed on the cavity,
wherein the cavity comprises at least one lateral side opening connected to the outside between the membrane layer and the substrate.

2. The acoustic wave resonator of claim 1, wherein:
the resonating part further comprises a resonance active region disposed on the cavity, and
the first electrode and the second electrode each comprise connection electrodes extended outside the resonance active region.

3. The acoustic wave resonator of claim 2, wherein 30 μm≤Ra/Hw≤200 μm is satisfied, Ra being an area (μm2) of the resonance active region, and Hw being a total length (μm) of the at least one opening.

4. The acoustic wave resonator of claim 3, wherein a width of each of the connection electrodes is greater than or equal to 60 μm.

5. The acoustic wave resonator of claim 2, wherein the total length of the at least one opening is greater than or equal to a total width of the connection electrodes.

6. The acoustic wave resonator of claim 1, wherein the substrate comprises an etch stop layer disposed on a surface thereof, and
the cavity is disposed between the etch stop layer and the membrane layer.

7. The acoustic wave resonator of claim 6, wherein the etch stop layer comprises a same material as the membrane layer.

8. The acoustic wave resonator of claim 1, wherein a portion of the cavity internal of a contour of the cavity and corresponding to a resonance active region of the resonating part has a cavity thickness deviation, where the cavity thickness deviation is expressed as $0 \text{ Å} < \Delta Cg \leq 340 \text{ Å}$ where $\Delta Cg$ is a difference between a maximum gap and a minimum gap of the portion of the cavity.

9. A filter comprising a plurality of the acoustic wave resonator of claim 1 arranged in a ladder-type filter structure.

10. A filter comprising a plurality of the acoustic wave resonator of claim 1 arranged in a lattice-type filter structure.

11. The acoustic wave resonator of claim 1, wherein the thickness deviation of the membrane layer is represented by a portion of the membrane layer having graded deviations over a length of the portion of the membrane layer.

12. An acoustic wave resonator, comprising:
- a resonance active region spaced apart from a substrate by a cavity, the resonance active region comprising a membrane layer, a first electrode, a piezoelectric layer, and a second electrode sequentially stacked on the cavity; and
- at least one opening formed in an outer portion of the cavity connecting the cavity with the outside;
- wherein a gap size of the at least one opening is expressed as $30 \text{ µm} \leq Ra/Hw \leq 200 \text{ µm}$ where Ra is an area (µm$^2$) of the resonance active region, and Hw is a total length (µm) of the at least one opening,
- wherein the at least one opening is formed at a lateral side portion of the cavity, and the gap size of the opening is the same as a gap size of the cavity at the outer portion of the cavity connecting the cavity with the outside.

13. The acoustic wave resonator of claim 12, further comprising respective connection electrodes extending to the outside of the resonance active region from the first electrode and the second electrode,
- wherein a width of each of the connection electrodes is greater than or equal to 60 µm.

14. The acoustic wave resonator of claim 13, wherein the total length of the at least one opening is equal to or greater than a total width of the connection electrodes.

15. The acoustic wave resonator of claim 12, further comprising a cavity layer interposed between the substrate and the resonance active region,
- wherein the cavity is disposed in the cavity layer.

16. The acoustic wave resonator of claim 15, further comprising an etching stop part disposed in the cavity layer and disposed along an edge of the cavity.

17. The acoustic wave resonator of claim 12, wherein the cavity has graded gap size deviations over a length of a portion of the cavity that is under a resonance active region of the resonating part.

* * * * *